(12) United States Patent
Baumann et al.

(10) Patent No.: US 7,912,106 B2
(45) Date of Patent: Mar. 22, 2011

(54) ENHANCED SURFACE-EMITTING PHOTONIC DEVICE

(75) Inventors: Kristian Gotthold Baumann, Krailling (DE); Rainer Friedbert Mahrt, Meilen (CH); Nikolaj Moll, Zurich (CH); Thilo Hermann Curt Stöferle, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/950,939

(22) Filed: Dec. 5, 2007

(65) Prior Publication Data

US 2009/0147818 A1    Jun. 11, 2009

(51) Int. Cl.
*H01S 5/00* (2006.01)
(52) U.S. Cl. .......................... 372/50.11; 372/96; 372/99
(58) Field of Classification Search ............. 372/50.11, 372/96, 99
See application file for complete search history.

(56) References Cited

U.S. PATENT DOCUMENTS

| 5,448,581 | A  | * | 9/1995  | Wu et al. ................. 372/45.01 |
| 6,853,666 | B2 |   | 2/2005  | Evans et al. |
| 6,975,664 | B1 | * | 12/2005 | Dodabalapur et al. ...... 372/102 |
| 7,009,216 | B2 | * | 3/2006  | Otsuka et al. ................. 257/98 |
| 7,733,936 | B2 | * | 6/2010  | Okamoto ................ 372/50.124 |
| 2005/0238079 | A1 |   | 10/2005 | Botez |

OTHER PUBLICATIONS

C. Karnutsch et al., "Improved organic semiconductor lasers based on mixed distributed feedback resonator design", Applied Physics Letters, 90, 131104 published Mar. 27, 2007.

* cited by examiner

*Primary Examiner* — Tod T Van Roy
(74) *Attorney, Agent, or Firm* — Cantor Colburn LLP; Stephen Kaufman

(57) ABSTRACT

A surface-emitting photonic device including a structure disposed therein to enhance a performance thereof. The structure includes a two dimensionally periodic second order distributed feedback device (DFB) to emit diffraction limited outcoupled laser light having a predetermined wavelength along a propagation direction that is substantially normal to a plane of the DFB, and a first order distributed Bragg reflector (DBR) coplanar with, adjacent to and surrounding the DFB, a geometry of the DBR being selected such that a bandgap of the DBR is maximized and centered around the predetermined wavelength of the emitted light, a substrate, and either an optical gain layer, or a semi-conductor quantum well laser disposed within the substrate.

3 Claims, 3 Drawing Sheets

ENHANCED SURFACE-EMITTING PHOTONIC DEVICE

BACKGROUND OF THE INVENTION

1. Field of the Invention

Aspects of the present invention relate to ail enhanced surface-emitting photonic device and, more particularly, to an enhanced surface-emitting photonic device including a structure disposed therein to enhance a performance thereof.

2. Description of the Background

Conventional compact and low-threshold lasers play an important role for pushing integrated optics towards series-production readiness and generally incorporate distributed Bragg reflectors (DBRs). An important drawback of DBRs, however, is that a feedback region thereof is spatially separated from the gain region. As a result, the devices are relatively large.

Another approach in conventional lasers is the use of distributed feedback (DFB) structures. Here, the gain region is incorporated into the feedback region. The main drawback of DFB, however, is that the lasing mode is provided at edges of the devices where the corresponding laser exits a resonator as a loss. The presence of this loss in these devices leads to a high lasing threshold thereof.

In either case, conventional lasing concepts have been generally implemented as linear gratings. An important drawback of linear gratings, however, is that the laser light is outcoupled in a fan-like manner, which may not be beneficial for most applications (e.g., fiber coupling).

SUMMARY OF THE INVENTION

In accordance with an embodiment of the invention, a surface-emitting photonic device is provided and comprises a structure disposed therein to enhance a performance thereof, the structure including a two dimensionally periodic second order distributed feedback device (DFB) to emit diffraction limited outcoupled laser light having a predetermined wavelength along a propagation direction that is substantially normal to a plane of the DFB, and a first order distributed Bragg reflector (DBR) coplanar with, adjacent to and surrounding the DFB, a geometry of the DBR being selected such that a bandgap of the DBR is maximized and centered around the predetermined wavelength of the emitted light, a substrate on which the structure is patterned, and either an optical gain layer, disposed above the substrate and the structure, or a semi-conductor quantum well laser disposed within the substrate.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTIONS OF THE DRAWINGS

The subject matter regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

DETAILED DESCRIPTION OF THE INVENTION

Figure 1:
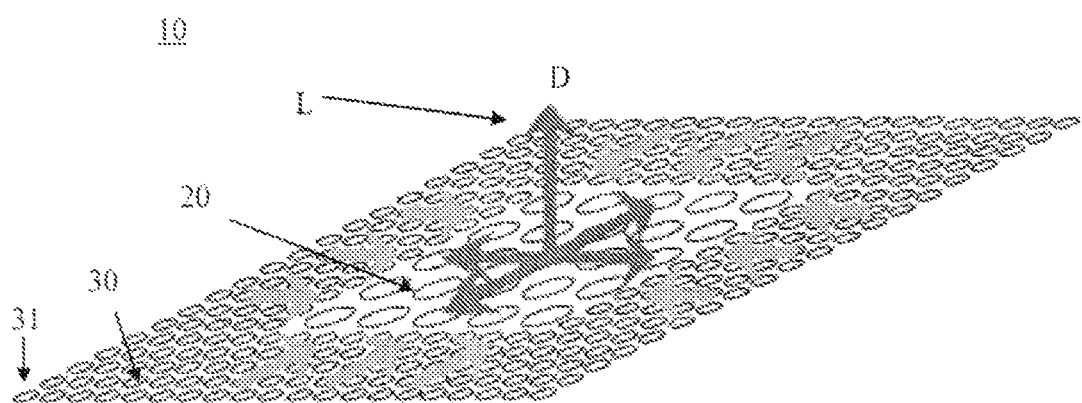
FIG. 1 is a schematic diagram of a distributed feedback (DFB)/distributed Bragg reflector (DBR) structure in accordance with an exemplary embodiment of the invention.
Figure 4:
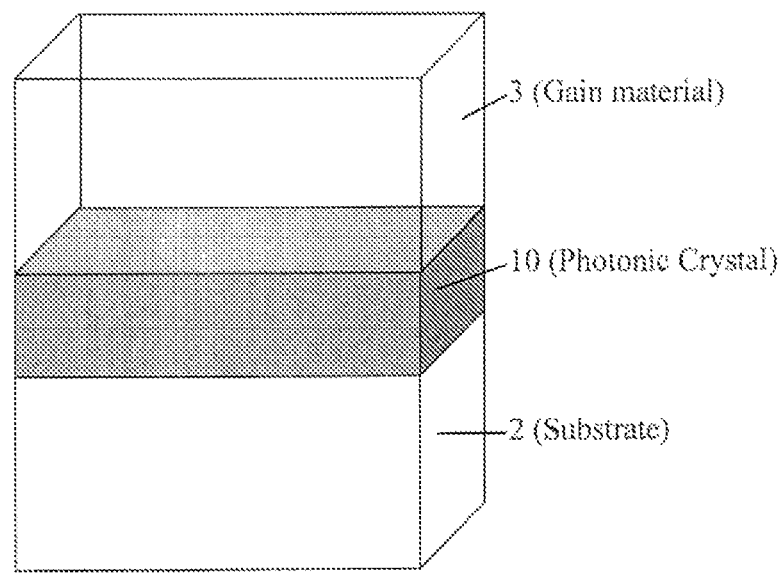
FIG. 4 is a perspective view of an enhanced surface emitting photonic device in accordance with an exemplary embodiment of the invention.
Figure 5:
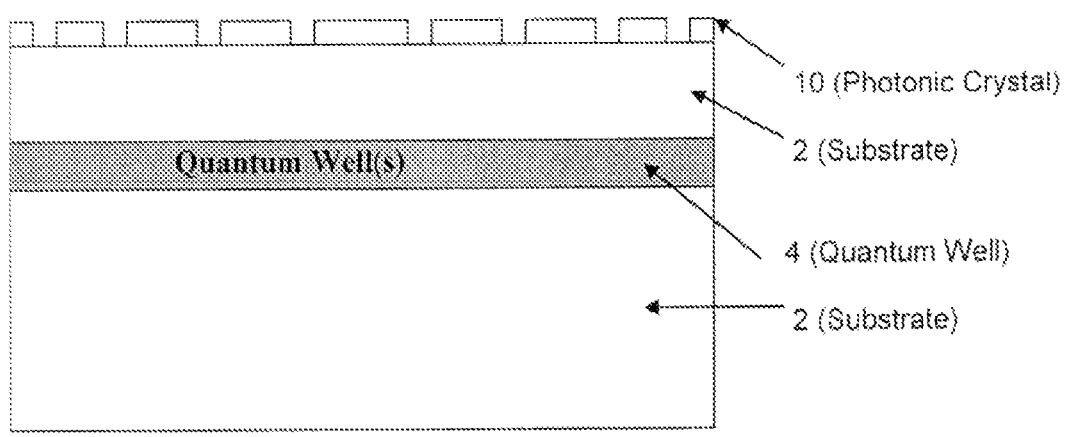
FIG. 5 is an elevational view of an enhanced surface emitting photonic device in accordance with an exemplary embodiment of the invention.

With reference to FIGS. 1, 4 and 5, an enhanced surface emitting photonic device 1, as shown in FIGS. 4 and 5, includes a photonic crystal as a distributed feedback/distributed Bragg reflector (hereinafter referred to as a "DFB/DBR") structure 10. An exemplary embodiment of the DFB/DBR structure 10 is illustrated schematically and not to scale in FIG. 1. As shown, the DFB/DBR structure 10 includes a two dimensionally periodic second order distributed feedback device (DFB) 20 surrounded by a first order distributed Bragg reflector (DBR) 30. As such, the DFB/DBR structure 10 provides for diffraction limited outcoupled emitted laser light, L, having a propagation direction (see arrow D) that is substantially normal to a plane of the structure 10.

Figure 2:
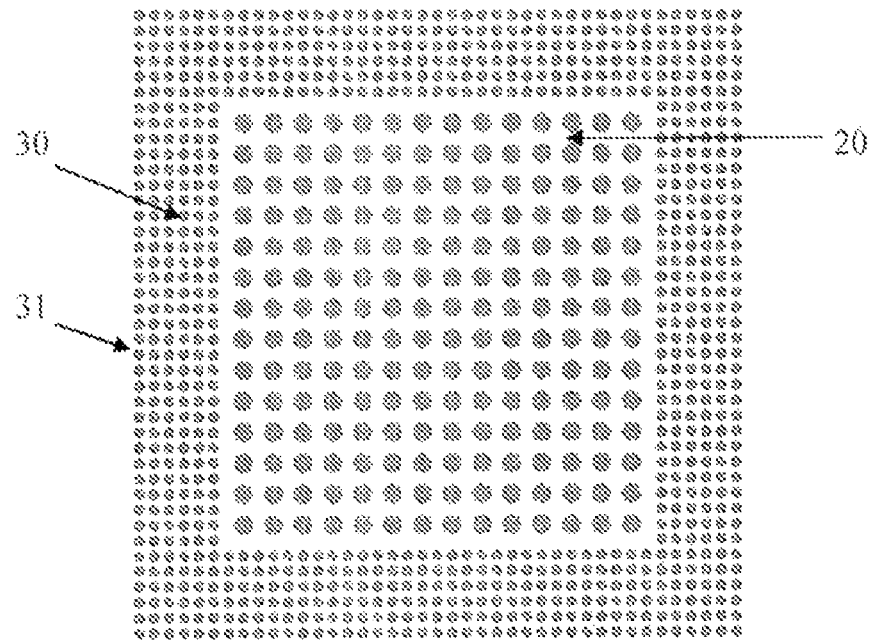
FIG. 2 is a plan view of a DFB/DBR structure in accordance with an exemplary embodiment of the invention.
Figure 3:
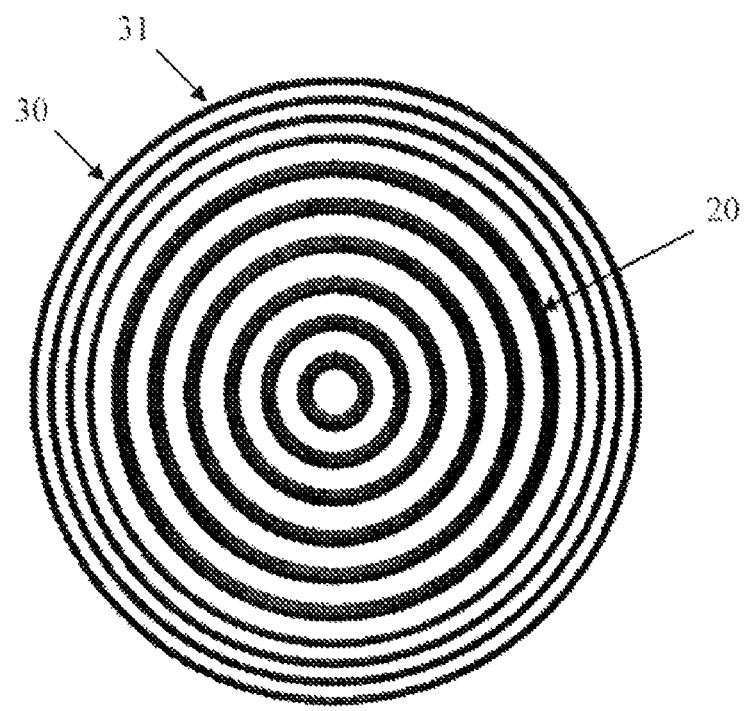
FIG. 3 is a plan view of a DFB/DBR structure in accordance with another exemplary embodiment of the invention.

With reference to FIGS. 1, 2 and 3, according to embodiments of the invention, the DFB/DBR structure 10 comprises the two dimensionally periodic second order distributed feedback device (DFB) 20 that acts, in this case, as a laser resonator. In this manner, a size of the DFB 20 may be tunable in accordance with lasing preferences, to emit laser light, L, having a predetermined wavelength. The DFB/DBR structure 10 further includes the first order distributed Bragg reflector (DBR) 30 that is coplanar with, adjacent to and surrounding the DFB 20.

In accordance with further embodiments of the invention, the DBR 30 is a periodic structure of a low or a high refractive index material comprising diffractive elements 31. The geometry of the DBR 30 is selectable in accordance with the size of the laser resonator (i.e., the DFB 20) and the predetermined wavelength of the laser light, L. That is, the geometry of the diffractive elements 31 of the DBR 30 is, at least partly, selected such that a bandgap of the DBR 30 is maximized and centered about the predetermined wavelength of the laser light, L. In this manner, an overall size of the DFB/DBR structure 10 can be minimized or the lasing threshold can be lowered. Further, the selected geometry of the DBR 30 can prevent light of the predetermined wavelength from propagating, due to an optical-field profile thereof decaying exponentially, and, consequently, reflecting back towards the DFB 20 (i.e., the laser resonator).

Thus, the size of the DFB 20 and the geometry of the DBR 30 can be tuned independently of one another and/or in accordance with one another to lower a lasing threshold of the structure 10 and/or reduce a footprint thereof. Further, by tuning the size of the DFB 20 and the geometry of the DBR 30 independently from one another, choosing between benefits of the lower lasing threshold and the smaller footprint is feasible. Still further, the diffraction limited outcoupled laser light, L, is a diffraction limited beam whose direction is perpendicular to a surface of the structure 10. That is, as noted above, a propagation direction of the diffraction limited outcoupled emitted laser light, L, is normal to a plane of the DFB/DBR structure 10.

With particular reference to FIG. 2, according to an embodiment of the invention, the DFB/DBR structure 10 may comprise a central square-lattice second-order photonic crystal (i.e., the DFB 20) that is surrounded by a square-lattice first-order photonic crystal (i.e., the DBR 30). In this embodiment, the DFB/DBR structure 10 is symmetric about two (2) axes.

Conversely, with particular reference to FIG. 3, according to another embodiment of the invention, the DFB/DBR structure 10 may alternately comprise a central second-order circular grating (i.e., the DFB 20) which is surrounded by a first-order circular grating (i.e., the DBR 30). In this embodiment, the DFB/DBR structure 10 is circularly symmetric.

Here, it is noted that other lattice geometries, such as hexagonal geometries and triangular geometries, for the DFB 20 and the DBR 30 are possible and may be used interchangeably with the shapes discussed above.

According to yet another embodiment of the invention, as shown in FIG. 4, the enhanced surface-emitting photonic device 1 may comprise the DFB/DBR structure 10 as having been fabricated on a suitable substrate 2. In this embodiment, the substrate may comprise, e.g., Si/SiO$_2$, and the DFB/DBR structure 10 may be patterned on a layer of, e.g., Ta$_2$O$_5$, TiO$_2$ or GaAs. Alternately, the DFB/DBR structure 10 may be patterned on the substrate 2 itself. The top layer 3 may comprise an optical gain layer.

With reference now to FIG. 5, still yet another embodiment of the invention is shown. Here, the enhanced surface-emitting photonic device 1 may comprise a semiconductor quantum well laser 4 (with single or multiple wells) being disposed within a substrate 2. Here, the substrate 2 may comprise, e.g., GaAs, and the semiconductor quantum well laser 4 may comprise a similar material with additional Indium doping (i.e., InGaAs). In this embodiment, the DFB 20/DBR 30 structure 10 is patterned on top of the device 1 and an optical gain material on top similar to that of the embodiment of FIG. 4 is unnecessary.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular exemplary embodiment disclosed as the best mode contemplated for carrying out this disclosure, but that the disclosure will include all embodiments falling within the scope of the appended claims.

We claim:

1. A surface-emitting photonic device comprising:
   a structure including:
   a two dimensionally periodic central square-lattice second order photonic crystal distributed feedback device (DFB) having a size that is tuned to emit diffraction limited outcoupled laser light having a predetermined wavelength along a propagation direction that is substantially normal to a plane of the DFB, and
   a square-lattice first order photonic crystal distributed Bragg reflector (DBR) coplanar with, adjacent to and entirely surrounding the DFB, such that a straight extension of any straight line that is coplanar with the DFB and which extends through a center of the DFB also extends from and to opposing portions of the DBR, the DBR including diffractive elements having geometries tuned independently of DFB size tuning and selected such that a bandgap of the DBR is maximized and centered around the predetermined wavelength of the emitted light;
   a substrate having an upper section on which the structure is entirely patterned and a lower section; and
   a semi-conductor quantum well laser interposed between the upper and lower sections of the substrate and having dimensions in a plane defined perpendicularly with respect to an emission direction of the emitted light that are substantially similar to like dimensions of the structure.

2. The surface-emitting photonic device according to claim 1, wherein the DFB and the DBR are both square and the DBR surrounds each side and corner of the DFB substantially evenly and in a parallel configuration along each side and at each corner.

3. A surface-emitting photonic device, comprising:
   a two dimensionally periodic central square-lattice second order photonic crystal distributed feedback device (DFB) having a size that is tuned to emit diffraction limited outcoupled laser light having a predetermined wavelength along a propagation direction that is substantially normal to a plane of the DFB;
   a square-lattice first order photonic crystal distributed Bragg reflector (DBR) coplanar with, adjacent to and entirely surrounding the DFB, such that a straight extension of any straight line that is coplanar with the DFB and which extends through a center of the DFB also extends from and to opposing portions of the DBR, the DBR including diffractive elements having geometries tuned independently of DFB size tuning and selected such that a bandgap of the DBR is maximized and centered around the predetermined wavelength of the emitted light;
   a substrate having an upper and a lower section, the upper section having a top surface on which the DFB and the DBR are entirely patterned; and
   a quantum well interposed between the upper and lower sections of the substrate and having dimensions in a plane defined perpendicularly with respect to an emission direction of the emitted light that are substantially similar to like combined dimensions of the DFB and the DBR.

* * * * *